United States Patent [19]
Mitra et al.

[11] Patent Number: 5,713,762
[45] Date of Patent: Feb. 3, 1998

[54] SELECTIVELY METALLIZED PLASTIC HOLD-DOWN CONNECTOR

[75] Inventors: Niranjan Mitra, Eindhoven; Ronald Bekker, Waalre, both of Netherlands

[73] Assignee: Berg Technology, Inc., Reno, Nev.

[21] Appl. No.: 503,127

[22] Filed: Jul. 17, 1995

[51] Int. Cl.[6] .................................................. H01R 13/648
[52] U.S. Cl. ............................ 439/607; 439/108; 439/931
[58] Field of Search .............................. 439/83, 101, 108, 439/607, 608, 931

[56] References Cited

U.S. PATENT DOCUMENTS

| | | | |
|---|---|---|---|
| 2,229,585 | 1/1941 | Osenberg | 173/328 |
| 4,455,448 | 6/1984 | Bertolina | 174/35 R |
| 4,628,410 | 12/1986 | Goodman et al. | 361/413 |
| 4,679,883 | 7/1987 | Assini et al. | 439/607 |
| 4,889,502 | 12/1989 | Althouse et al. | 439/607 |
| 4,977,668 | 12/1990 | McKenzie, Jr. | 29/852 |
| 5,028,492 | 7/1991 | Guenin | 439/931 |
| 5,035,649 | 7/1991 | Collier et al. | 439/607 |
| 5,145,396 | 9/1992 | Yeung | 439/326 |
| 5,147,209 | 9/1992 | Litwin et al. | 439/931 |
| 5,198,793 | 3/1993 | Leveque | 338/172 |
| 5,228,871 | 7/1993 | Goodman | 439/931 |
| 5,344,341 | 9/1994 | Yoshino | 439/607 |
| 5,413,491 | 5/1995 | Noschese | 439/108 |
| 5,509,823 | 4/1996 | Harting et al. | 439/607 |

FOREIGN PATENT DOCUMENTS 31 16 201   11/1982   Germany ........................ 13/658

Primary Examiner—Gary E. Elkins
Attorney, Agent, or Firm—Daniel J. Long; M. Richard Page

[57] ABSTRACT

A connector to be mounted to a substrate having a housing of dielectric material which housing comprises a portion (2; 6; 28; 38) provided with a metal layer (7; 8; 25; 35). This portion is located on a side of the connector (1; 1'; 21; 31) to be pre-positioned adjacent a substrate (15) so that the metal layer (7; 8; 25; 35) functions as to solderably join and fix the connector to the substrate (15).

9 Claims, 6 Drawing Sheets

SELECTIVELY METALLIZED PLASTIC HOLD-DOWN CONNECTOR

BACKGROUND OF THE INVENTION

1. Field of the Invention

The present invention relates to a connector to be mounted to a substrate, having a housing of dielectric material. Such connectors are now widely used in the field of electrical connectors that are connected to a substrate, e.g. a printed circuit board (pcb), at one of their sides and are able to receive a mating connector at one of their other sides. Such connectors accommodate terminals that extend from the connectors and, mostly, have flat contact faces bent away in such a way that these faces may be soldered to corresponding contact pads on the substrate.

2. Brief Description of Prior Developments

In practice, it is very difficult to produce these bent faces in such a way that they are located substantially within one plane. Moreover, it is very difficult in practice to produce substrates which are substantially flat. Therefore, it is known to produce these faces at an angle slightly less than 90° relative to centre lines through through-holes of the connector accommodating the terminals in order to create a little spring action (and therefore tolerance) of each contact face relative to the substrate surface when mounting the connector to the substrate.

When further miniaturization is required more terminals need be located on a predetermined area and connectors of fixed size are required to comprise more terminals. Alternatively, larger connectors need be developed having more terminals per standard surface area than before. Therefore, to allow for further miniaturization the bent contact faces of the terminals as well as the flatness of the substrates do have to meet increasing tolerance requirements. Every deviation of the ideal model results in inherently built in stress in the connection between the connector and the substrate which may lead to either bad electrical connections or to metal pads coming off from the substrate.

In order to avoid these disadvantages Applicant has already proposed (Dutch Patent Application 9301779) a connector in which, before the connector is mounted to a substrate, each terminal is allowed to be moved somewhat within its cavity in the connector. Thereby, a predetermined maximum curvature of the substrate may be easily compensated without introducing mechanical stress in the connection between the substrate and the connector. However, this is not a very cheap solution to the problem and mounting such a connector to a substrate may not always be easy, e.g. as some of the terminals are moved entirely inwards whereas others are not.

The application of electrical components on the outside surface of a connector which are connected to connector terminals by means of metal tracks on the connector housing is known as such from U.S. Pat. No. 5,141,454.

SUMMARY OF THE INVENTION

The object of the present invention is to provide a connector which may be easily and reliably mounted to a substrate.

A further object of the invention is provide such a connector which is easy and cheap to be manufactured.

A still further object of the invention is to provide a connector by which, when mounted to a substrate, the mechanical stress between the connector and the substrate is compensated by means additional to the solder connections between the contact faces and the metal pads on the substrate.

Therefore, the connector to be mounted to a substrate having a housing of dielectric material according to the invention is characterized in that said housing comprises a portion provided with a metal layer, said portion being located on a side of the connector to be pre-positioned adjacent a substrate whereby the metal layer functions as means to solderably join and fix the connector to the substrate. Said metal layer on said portion of the housing will be fixed, e.g. by a soldering process, to corresponding ground layers on the substrate. When fixing the connector and the substrate together additional mechanical force may be applied to compensate for curvatures in the substrate and/or manufacturing tolerances in the connector. The surface area of the portion of the housing to be fixed to the substrate may have a relatively large value. The larger the surface area of said portion the larger the binding force between the connector and the substrate and the larger the compensating force for the stress inherently built in in the connection between the contact faces of the terminals and the metal pads on the substrate.

Said portion of the connector may have any suitable shape to contact the substrate. In a first embodiment, said portion comprises a set of stand-off members, each extending from a side of the connector and each being at least partly provided with said metal layer.

Alternatively, said portion comprises rims being at least partly provided with said metal layer and having recesses to accommodate terminals.

In addition to said portion the connector may comprise a set of hold-down pegs each located at the same side of the connector as said portion and each being provided with a further metal layer and each being intended to fit into corresponding cavities of said substrate. Said hold-down pegs have two functions: first of all, these hold-down pegs will be soldered into corresponding cavities of the substrate, which cavities may be plated or not, and secondly these hold-down pegs support the alignment between the hold-down connector and the substrate when fixing them together.

The housing of the connector may be provided with metal tracks connected to electrical components which are located on said housing, and to terminals of the connector. This may support connection lines to be as short as possible.

If required, the connector may be at least partly shielded by a shielding layer.

The invention is also directed to a connector system which comprises at least one of the connectors defined above and a substrate which is provided with signal layers to be connected to corresponding terminals of the connector and ground layer to be connected to said portion of the connector.

If the connector comprises hold-down pegs as defined above, the substrate of such a connector system also comprises cavities into which respective hold-down pegs have to be inserted and fixed.

BRIEF DESCRIPTION OF THE DRAWINGS

The present invention will be further explained by referring to some drawings, in which, by way of example only, some embodiments of the present invention are shown.

BRIEF DESCRIPTION OF THE PREFERRED EMBODIMENT

Figure 1A:
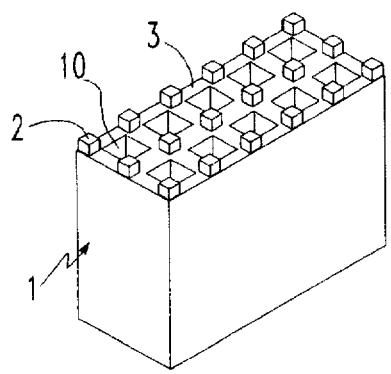
FIGS. 1a to 1d show subsequent manufacturing steps of a connector having a housing with stand-offs.
Figure 1B:
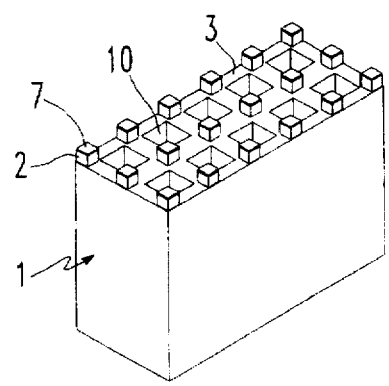
Figure 1C:
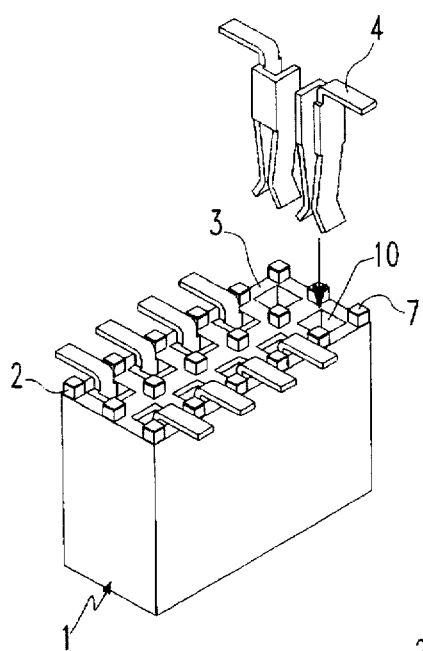

In FIG. 1a a connector 1 is shown having several stand-offs 2 located at one side 3 of the connector 1. The housing of connector 1 is provided with several cavities 10 to receive terminals 4 (FIG. 1c). The connector 1 shown in FIG. 1a is preferably integrally made.

In the next manufacturing step (FIG. 1b) all stand-offs 2 are provided with a metal layer 7. This can be done by the selective metallization method described in copending European patent application (BO 39328) of the same Applicant. However, any other method to selectively metallize stand-offs 2 may be carried out.

After having metallized all stand-offs 2 with metal layer 7 terminals 4 are inserted in cavities 10 (FIG. 1c).

Each terminal 4 has at least one contact face bent sidewards to contact a corresponding signal layer 16 on a substrate 15, e.g. a printed circuit board (PCB).

Figure 1D:
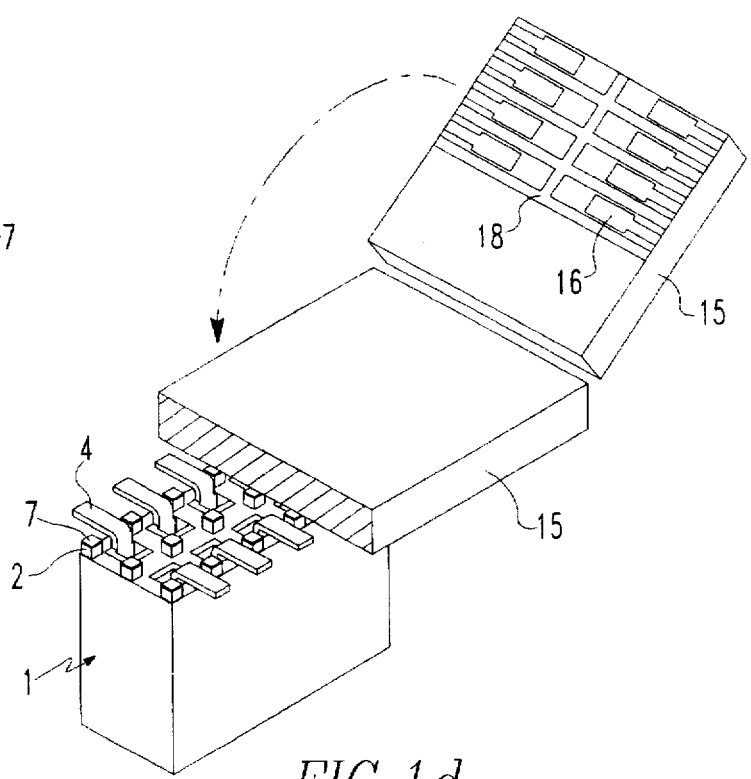

Each metal layer 7 on each stand-off 2 is intended to be connected to a ground layer 18 on the substrate 15. The dimensions of the ground layer 18 and the signal layers 16 correspond to the mutual distances between the stand-offs 2 and the mutual distances between the terminals 4, as generally depicted in FIG. 1d.

By soldering the metal layers 7 to the ground layer 18 the joining force between the connector 1 and the substrate 15 is significantly enhanced. The number of stand-offs and their location on the contact side of the connector presents no problem since they are located in a relatively "redundant" area of the connector: i.e. they are located at the edges of the side walls between the cavities 10, which side walls cannot be left out.

Figure 2A:
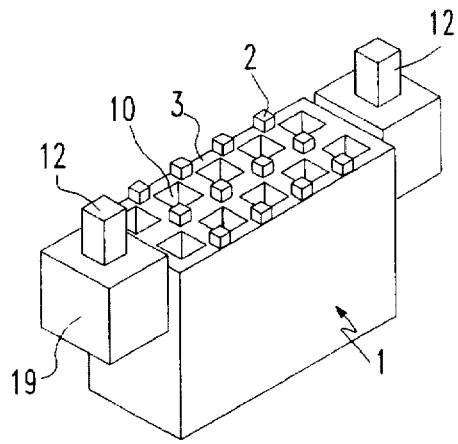
FIGS. 2a to 2d show subsequent manufacturing steps of a connector having a housing with stand-offs and hold-down pegs.
Figure 2B:
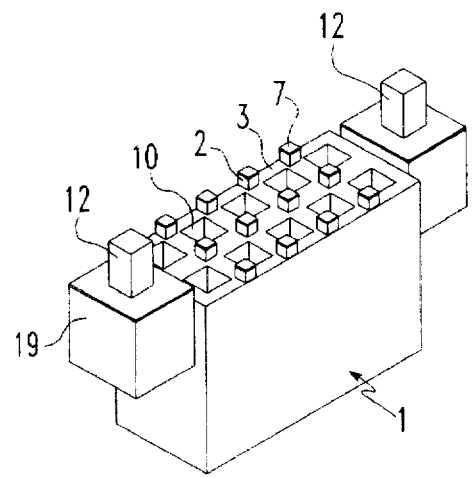
Figure 2C:
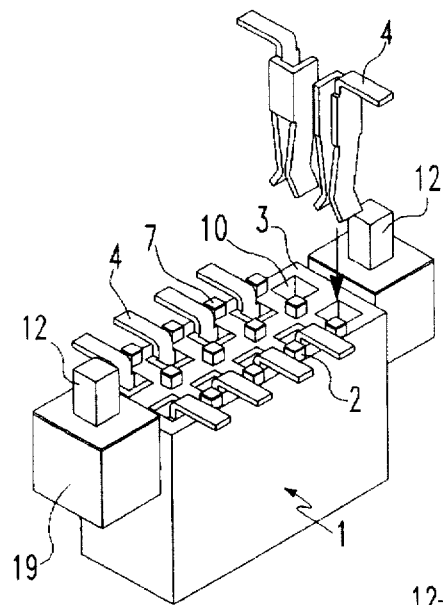
Figure 2D:
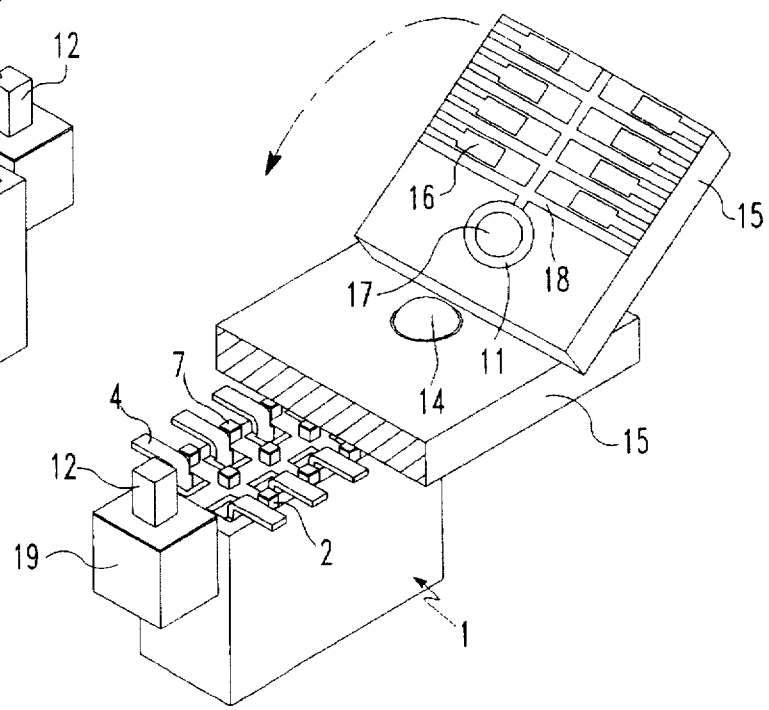

FIGS. 2a to 2d show an alternative connector according to the invention. The same reference signs as in FIGS. 1a to 1d refer to the same parts of the connector. In addition to the parts already described referring to FIGS. 1a to 1d the connector 1 according to FIGS. 2a to 2d comprises two hold-down pegs 12 located on extensions 19. The additional hold-down pegs 12 are made of plastic and preferably integrally made with the connector 1. FIG. 2b shows that the hold-down peg 12 is metallized in the same step in which the stand-offs 2 are metallized with a metal layer 7. In FIG. 2c it is shown that the connector 1 receives terminals 4 in cavities 10. FIG. 2d shows that the substrate 15 comprises additional cavities 17 to receive the hold-down pegs 12 of the connector 1. The substrate 15 may comprise a metal ring 11 surrounding the cavity 17 and intended to be soldered to a metallized part of extension 19, as shown in FIG. 2d.

Figure 3A:
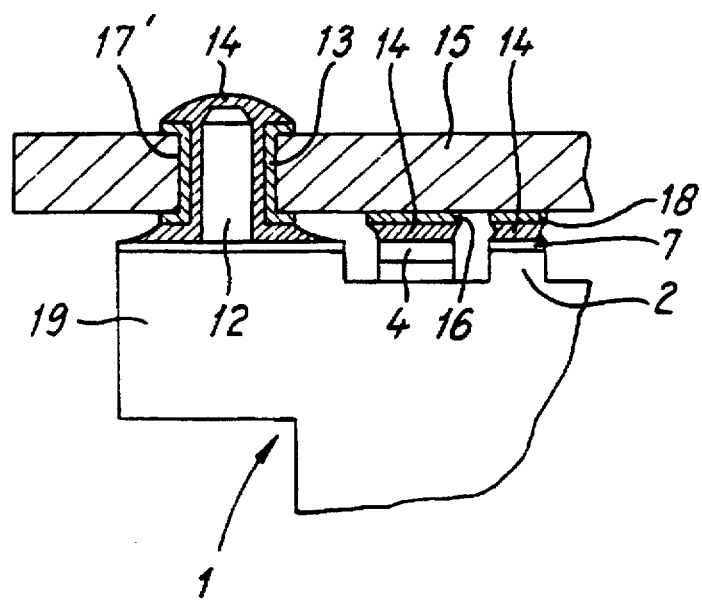
FIGS. 3a and 3b show cross-sections of alternative modes of mounting a connector according to FIGS. 2a to 2d to a substrate by means of a hold-down peg.
Figure 3B:
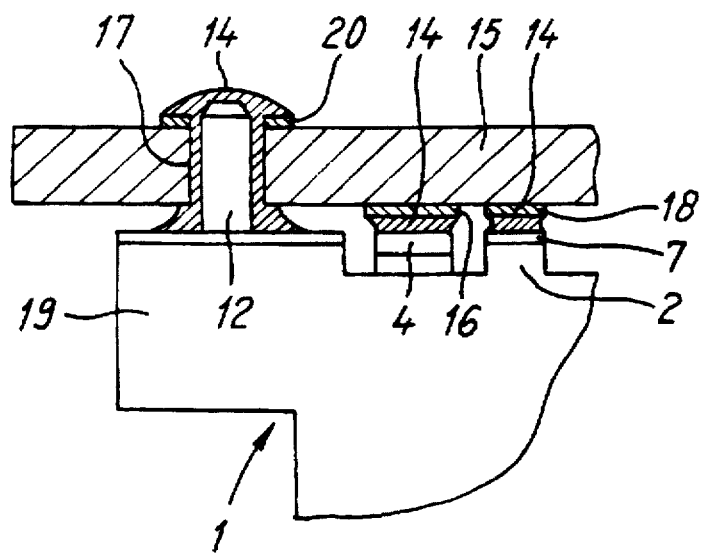

FIGS. 3a and 3b, respectively, show cross-sections of a connection between a connector 1 having a hold-down peg 12 and a substrate 15 when a reflow soldering process and a wave soldering process, respectively, is used. When a reflow soldering process (FIG. 3a) is used the cavity 17' is preferably plated with a metal layer 13. When a wave soldering process (FIG. 3b) is used there is an external supply of solder when fixing the connector 1 and the substrate together and the metal layer 13 may be omitted. An additional metal ring 20 surrounding the cavity 17 at the side of the substrate 15 opposite the connector 1 may support the connection between the cavity 17 and the hold-down peg 12, as depicted in FIG. 3b. Each terminal 4 is connected to a corresponding signal layer 16 by means of solder 14. Each metal layer 7 on each stand-off 2 is connected to a corresponding part of the ground layer 18 by means of solder 14. FIGS. 3a and 3b clearly show that stand-offs 2 extend from the surface of connector 1 facing the substrate 15 in such a way that bent away contact faces of the terminals 4 have enough space to extend between adjacent stand-offs 2 (or between extension 19 and its neighbouring stand-off 2).

FIGS. 4a to 4d show subsequent manufacturing steps for an alternative hold-down connector. Again, the same reference signs refer to the same parts or components as in the preceding figures. Instead of only selectively metallizing the stand-offs 2 with a metal layer 7 also the entire side surface is metallized with a shielding layer 5. The shielding layer 5 may be made in the same manufacturing step as the metal layer 7 and electrically contacts those metal layers 7 which are located on stand-offs 2 at the edges of connector 1. This may be easily achieved by the selective metallization method described in the copending European patent application (BO 39328) of the present Applicant, referred to above. However, this may also be established by other selective metallization processes.

Figure 4A:
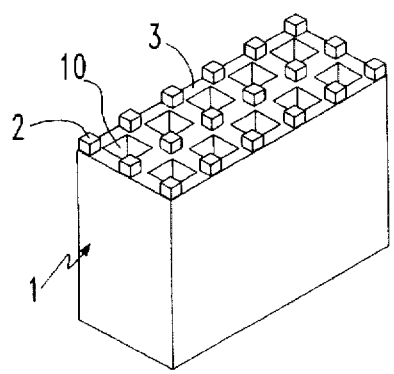
FIGS. 4a to 4d show subsequent manufacturing steps of a connector with a housing with stand-offs and a shielding layer.
Figure 4B:
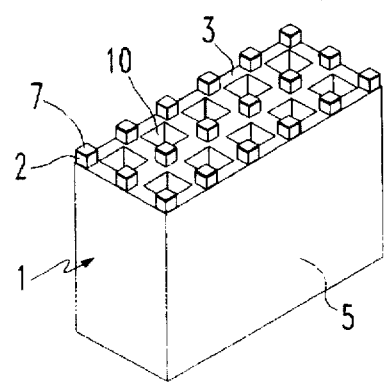
Figure 4C:
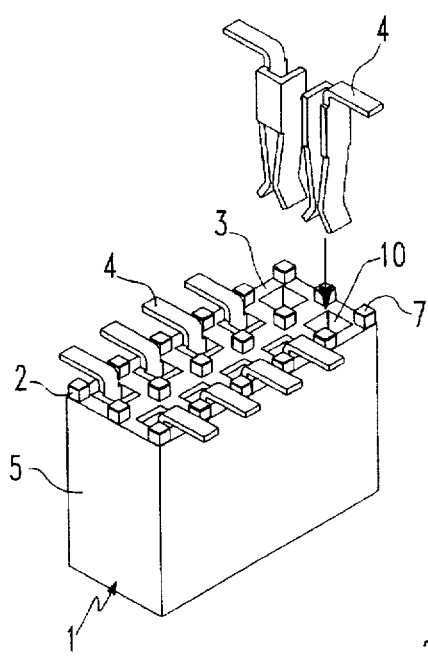
Figure 4D:
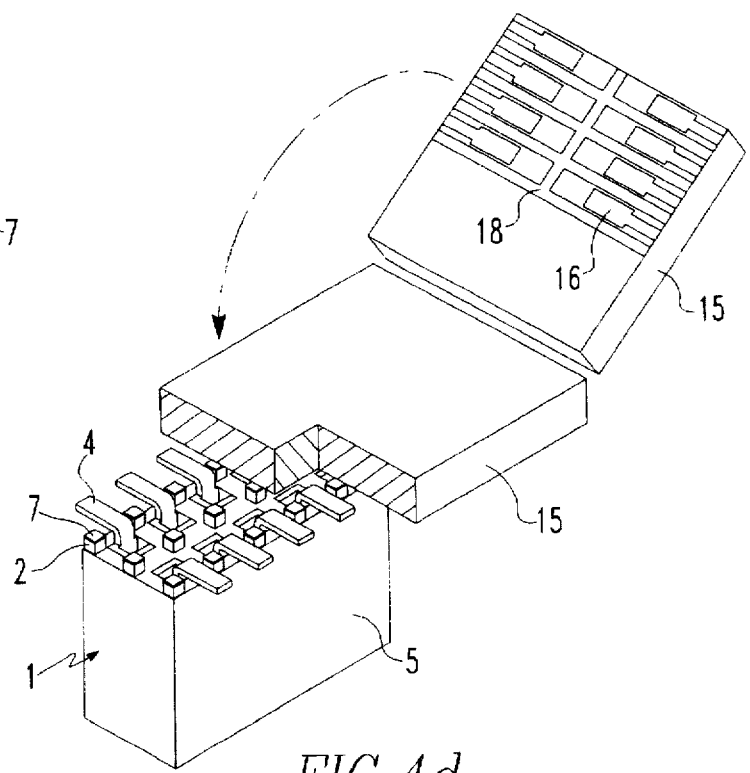

The connector 1 as shown in FIGS. 4c and 4d is shielded by the shielding layer 5 against external electromagnetic interference. Since the shielding layer 5 electrically contacts some of the metal layers 7 and all metal layers 7 are soldered to the ground layer 18 on the substrate 15 the shielding layer 5 is at ground potential.

The embodiment shown in FIGS. 4a to 4d may also have extensions 19 provided with hold-down pegs 12 as illustrated in FIGS. 2a to 2d.

FIGS. 5a to 5d show subsequent manufacturing steps of a further alternative embodiment of a hold-down connector.

Again, the same reference signs refer to the same parts or components as in the preceding figures.

Instead of using stand-offs 2, as in the embodiments according to FIGS. 1a to 4d, the connector 1' according to FIGS. 5a to 5d comprises rims 6 that may be the edges of the side walls between adjacent cavities 10. These rims 6 are at least partly provided with a metal layer 8. At the side edges of the connector 1' the rims 6 do have recesses 9 for the bent away contact faces of the terminals 4. Preferably, the contact faces of the terminals 4 are bent relative to the centre lines through the cavities 10 slightly less than 90°. Then the end parts of the contact faces of the terminals 4 will first contact the substrate 15 when fixing the connector 1' to the substrate 15 in order to have a reliable connection between each terminal 4 and its corresponding signal layer 16 on the substrate 15. Again, the metal layer 8 is soldered to the ground line 18 on the substrate 15, thereby enhancing significantly the connection force between the connector 1' and the substrate 15.

In a preferred embodiment, the external parts of the rims 6 adjacent the internal surfaces of the cavities 10 are not metalized in order to prevent short circuits between metal layer 8 and terminals 4 and to have more tolerance when mounting the connector to the substrate 15.

Figure 5A:
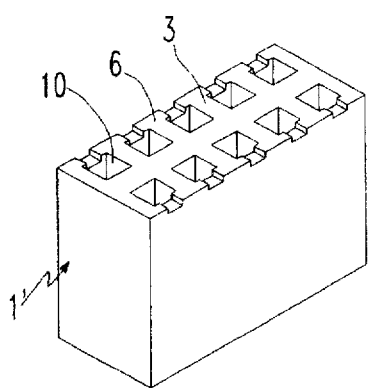
FIGS. 5a to 5d show subsequent manufacturing steps of a connector having a housing with contact rims.
Figure 5B:
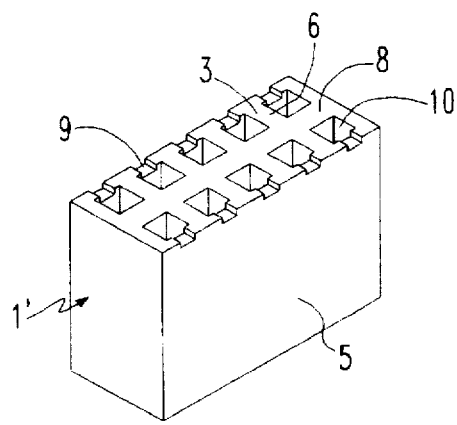
Figure 5C:
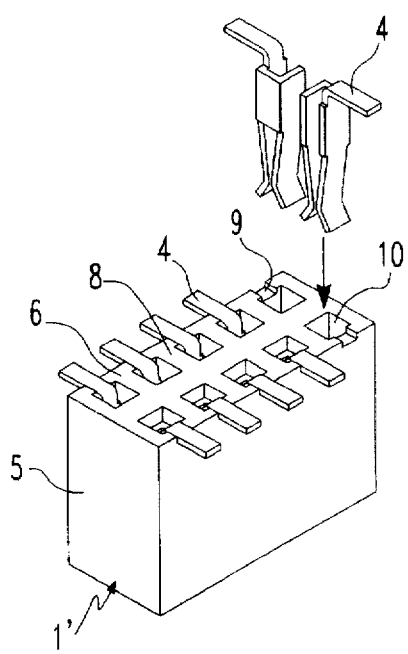
Figure 5D:
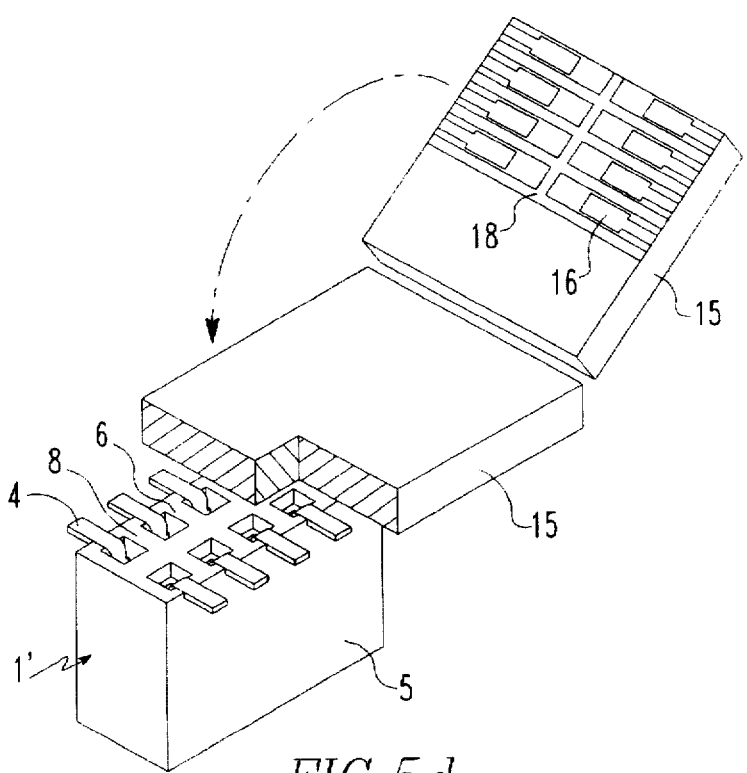

As shown in FIGS. 5b to 5d the connector 1' may be shielded by a shielding layer 5. However, this shielding layer 5 may be omitted if it is not required.

Also the embodiment of the connector 1' shown in FIGS. 5a to 5d may have extensions 19 provided with hold-down pegs 12 as shown in FIGS. 2a to 2d.

In FIGS. 2a to 2d the hold-down pegs are shown to have square cross-sections. However, if required, the hold-down pegs 12 may have any other cross-section, including a circular one or any polygonal shape. Moreover, the end part of any hold-down peg 12 may be beveled, as shown in cross-section FIGS. 3a and 3b, in order to ease insertion of the hold-down pegs 12 into cavities 17, 17'.

Figure 6A:
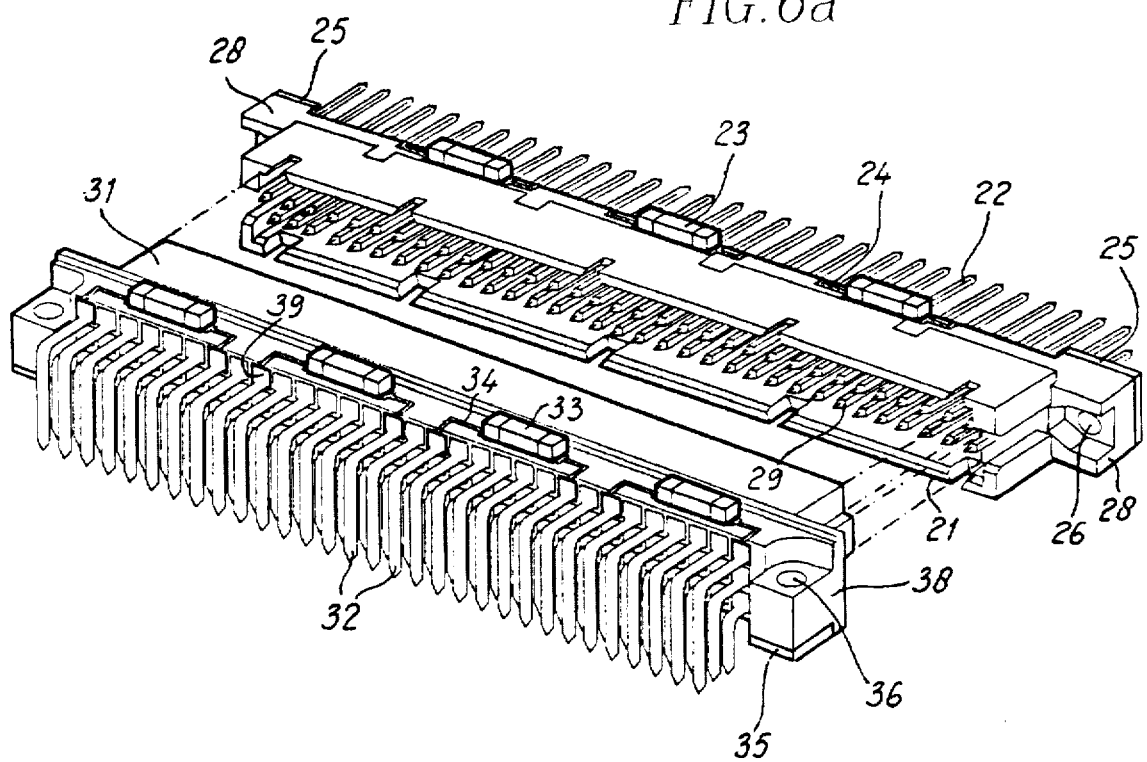
FIGS. 6a and 6b show alternative connectors provided with electrical components on their surface.
Figure 6B:
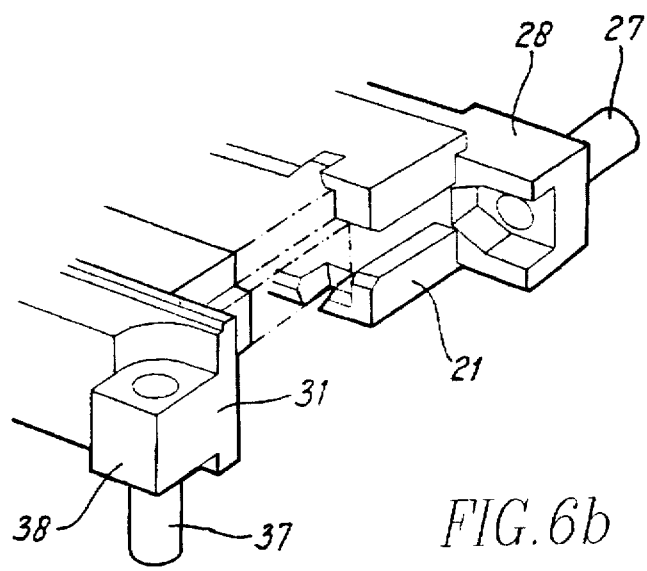

FIGS. 6a and 6b show that the hold-down of connectors to substrates 15 by means of additional metal layers 7, 8 on spare surface area of the connector 1, 1' is not only restricted to connectors having terminals comprising contact faces bent sidewards, as in the embodiments shown in FIGS. 1a to 5b.

FIG. 6a shows two connectors 21 and 31 which can be connected together. Each of these connectors 21, 31 is to be connected to a corresponding substrate (not shown). To this end, connector 21 comprises connection ends 22 extending from respective contact pins 29. These connection ends are to be inserted in corresponding contact holes of the substrate. The connector 21 is provided with extensions 28 which are normally provided with a through-hole 26 to receive connecting means (not shows) like a bolt. To enhance the hold-down between the connector 21 and the substrate (not shown) the extension 28 is provided with a metal layer 25 which is to be soldered to a corresponding ground layer on the substrate.

FIG. 6a also shows a connector 31 which is to fixed to a substrate (not shown) under an angle of substantially 90°. To that end the connector 31 comprises terminals 32 which are bent about substantially 90°. The connector 31 is provided with extensions 38 that are usually provided with holes 36 to receive connecting means, like a bolt. However, in the present invention the extensions 38 are provided with a metal layer 35 to be soldered to a corresponding ground layer on the substrate (not shown).

In embodiments of the invention where no shielding 5 is required, the side surfaces of the connectors are free to support additional electrical components which are to be connected between different terminals within one connector. This is shown in FIG. 6a. At least some of the cavities 39 of the connector 31 are internally metallized and connected to metal tracks 34 on the outside surface of the connector 31. The metal tracks 34 lead to terminal points for the connection of electrical components 33.

Like the connector 31 the connector 21 may also be provided with electrical components 23 which are connected to metal tracks 24 leading to cavities internally metallized and accommodating corresponding contact pins 29.

Of course the embodiments of the connectors shown in FIGS. 1a to 1d and of FIGS. 2a to 2d may also be provided with metal tracks on the outside surface of the connector 1 leading to electrical components supported on the outside surface of the connector 1.

The embodiments of the connectors 1 and 1' of FIGS. 4a to 4d and of FIGS. 5a to 5d, respectively, may in a further alternative embodiment only partly be shielded in order to leave some surface area available for the application of electrical components as shown in the embodiments of FIG. 6a. Of course in such an embodiment the electrical performance as regards shielding effectiveness of shielding layer 5 will be decreased.

FIG. 6b shows alternative connectors 21, 31 in which the metal layers 25 and 35, respectively, are replaced by hold-down pegs 27 and 37, respectively. For ease of understanding all details regarding terminals 22, 32 of the connectors 21 and 31 are left ou in FIG. 6b.

To manufacture a connector according to any of the embodiments shown in FIGS. 1a to 6b the method disclosed in copending European patent application (BO 39328) of the present Applicant may be applied. In general, this means that the following steps can be carried out:

a. depositing a first, electroless metal layer of a first predetermined thickness on the surface of the hold-down connector;

b. ablating predetermined traces of said first metal layer in order to produce first metal layer subareas located at predetermined surface subareas of the connector, which first metal layer subareas are electrically separated from the remaining area of said first metal layer;

c. depositing a second, galvanic metal layer of a second predetermined thickness to the first metal layer subareas only;

d. removing the remaining area of said first metal layer.

The first metal layer subareas referred to above in steps b. and c. comprise the metal layer 7 in the embodiment according to FIGS. 1a to 1d, FIGS. 2a to 2d, and FIGS. 4a to 4d, the metal layer on hold-down pegs 12 and on the extensions 19 supporting the hold-down pegs 12 in FIGS. 2b to 3b, the shielding layer 5 in FIGS. 4b to 4d, FIGS. 5b to 5d, the metal layer 8 in FIGS. 5b to 5d, the metal layers 25, 35 in FIG. 6a, and the metal layer on the hold-down pegs 27, 37 in FIG. 6b. Besides, they comprise the metal tracks 24, 34 on the connectors 21, 31 of FIG. 6a. By making traces of appropriate shapes around the metal layers and tracks referred to above by appropriate means, as further explained in copending European patent application (BO 39328) the connectors according to the invention with the required selectively metallized areas may easily be obtained. However, connectors according to the embodiments of the present invention are not restricted to be manufactured by the method referred to. Any other suitable method will do.

When the method according to said copending European patent application (BO 39328) is used a high energy beam may be used, for example, an electron beam or ion beam. A light beam or a laser beam may be used instead, whereas also grinding may be used. Removing of any non-selected metal layer areas in step d. referred to above may be done by chemical etching steps or by grinding processes. The first metal layer may be made of electroless copper or nickel and may have a thickness of 1 to 2 μm. The second thickness may be 5 to 10 μm. The galvanic metal layer may be coated with a top coat finish layer, for instance, made of nickel, gold, or tin-lead, which finish layer may have a thickness between 2 to 4 μm.

What is claimed is:

1. A housing for an electrical connector comprised of a dielectric material and adapted to be mounted on a substrate and characterized in that said housing comprises a portion (2; 6; 28; 38) provided with a metal layer (7; 8; 25; 35), said portion being located on a side of the connector (1; 1'; 21; 31) to be pre-positioned adjacent the substrate (15) whereby the metal layer (7; 8; 25; 35) functions as means to solderably join and fix the connector to the substrate (15).

2. The housing according to claim 1 characterized in that said portion comprises a set of stand-off members (2) each extending from a side (3) of the connector (1) and each being at least partly provided with said metal layer (7).

3. The housing according to claim 1 characterized in that said portion comprises rims (6) being at least partly provided with said metal layer (8) and having recesses (9) to accommodate terminals (4).

4. The housing according to claim 1 characterized in that the connector comprises a set of hold-down (12) each located at the same side of the connector s said portion and each being provided with a further metal layer (13), and each being intended to fit into corresponding cavities (17) of said substrate (15).

5. The housing according to claim 1 characterized in that housing of the connector (21; 31) is provided with metal tracks (24; 34) connected to electrical components (23; 33), which are located on said housing, and to terminals (22; 32) of the connector.

6. The housing according to claim 1 characterized in that the connector is at least partly shielded by a shielding layer (5).

7. A connector comprising at least one connector according to claim 1 and a substrate (15), the substrate being provided with signal layers (16) to be connected to corresponding terminals of the connector and ground layers (18) to be connected to said portion of the connector.

8. A connector system comprising at least one having according to claim 7 a substrate (15), the substrate being provided with signal layers (16) to be connected to corresponding terminals of the connector, ground layers (18) to be connected to said portion of the connector and cavities (17; 17') into which respective hold-down pegs (12) have to be inserted and fixed.

9. A connector system according to claim 8 characterized in that the cavities (17') are plated with a still further metal layer (13).

* * * * *